7/29/86 XR 4,603,276

United States Patent [19]

Coursant

[11] Patent Number: 4,603,276

[45] Date of Patent: Jul. 29, 1986

[54] TRANSDUCER COMPRISING A NETWORK OF PIEZOELECTRIC ELEMENTS

[75] Inventor: Roger H. Coursant, Paris, France

[73] Assignee: U.S. Philips Corporation, New York, N.Y.

[21] Appl. No.: 734,380

[22] Filed: May 15, 1985

[30] Foreign Application Priority Data

May 22, 1984 [FR] France ............................... 84 07957

[51] Int. Cl.[4] ............................................ H01L 41/08

[52] U.S. Cl. ..................................... 310/368; 310/334

[58] Field of Search ............... 310/367, 368, 360, 361, 310/320, 334–337; 73/642, 644

[56] References Cited

U.S. PATENT DOCUMENTS 4,101,795 7/1978 Fukumoto ........................... 310/336
4,139,793 2/1979 Michel ........................... 310/368 X
4,247,797 1/1981 Echigo et al. ........................ 310/361
4,305,014 12/1981 Borburgh et al. .............. 310/368 X
4,525,647 6/1985 Dworsky ........................... 310/361

*Primary Examiner*—Mark O. Budd
*Attorney, Agent, or Firm*—Jack E. Haken

[57] ABSTRACT

An ultrasonic transducer comprising a network of parallel piezoelectric transducer elements having a width W or in the form of a parallelepipedon having a length H and a width W, characterized in that the thickness T of the said transducer elements is equal to half the wavelength corresponding to a frequency F which is equal to the average value of at least two of the successive piezoelectric resonance frequencies of the piezoelectric material concerned, the products of the thickness and the resonance frequencies framing at least two successive vibratory modes of this material in the bidimensional diagram of the curves F·T=f(W/T) of the spread of the resonance frequencies relating to the piezoelectric material concerned or in the tridimensional diagram of the curves F·T=f(W/T, H/T).

2 Claims, 11 Drawing Figures

TRANSDUCER COMPRISING A NETWORK OF PIEZOELECTRIC ELEMENTS

The invention relates to an ultrasonic transducer comprising a linear assembly of parallel piezoelectric transducer elements. The transducer elements in such an arrangement each have a length H which is great with respect to the other dimensions (the width W and the thickness T). This arrangement can be used, for example, in the field of the non-destructive control of materials or in the field of inspection of biological tissues.

U.S. Pat. No. 4,101,795 describes an ultrasonic transducer arrangement, whose piezoelectric transducer elements (cf. FIGS. 1 to 3 of this patent) can vibrate due to specific geometric measures in the pure thickness mode, i.e. in the ideal manner in which a piston is displaced, without undesirable coupling with perturbing vibratory modes.

The knowledge of the vibration modes of thin piezoelectric elements is important for the design of linear assemblies of transducers. Such a knowledge can be obtained by experiments (or theoretically by means of a bi- or tridimensional modelling, for example, by a method based on finite elements) so that the relations between the parameters, upon which the operation of the transducer depends, are defined as completely as possible. These relations can be made visible in the form of various so-called Fabian-Sato diagrams which represent the curves of the spread of the resonance frequencies of the relevant material (cf. E. L. Fabian, studies published in MASON "Physical Acoustics", Volume 1, Part A, chapter 6, p. 456 and 457, Academic Press 1964; cf. also the aforementioned patent, of which Mr. Sato is a co-inventor). (These references are incorporated herein, by reference, as background material) These curves show the relation between the ratio W/T and the product F·T of the resonance frequency, F and the thickness of the piezoelectric elements for the different modes of vibration of the material (fundamental and harmonic modes). FIG. 4 of the aforementioned patent shows an example of such a network of curves.

This network shows that the single mode operation of the arrangement described in the aforementioned patent is obtained by imposing on the ratio W/T an upper limit of the order of 0.8, below which value the effective electromechanical coupling coefficient assumes a high value (a curve of the variation of the electromechanical coupling coefficient, such as that of FIG. 9 of the aforementioned patent, supplies information about the relative amplitude of the vibrations obtained in the consideration of the vibration mode according to the choice of W/T). However, there is an inherent limitation in the choice of such values of W/T because the realization of a transducer becomes more complex, the manufacture of slots between successive piezoelectric elements of the transducer becomes more difficult as the width of these elements gets smaller.

The invention has for its object to provide a novel transducer structure, which no longer exhibits this limitation relative to the ratio W/T and which can consequently be realized in a simpler manner.

The ultrasonic transducer arrangement according to the invention is characterized in that the thickness T of the said transducer elements is equal to one-half the wavelength corresponding to a frequency F which is equal to the average value of at least two of the successive piezoelectric resonance frequencies of the piezoelectric material so that the products of this thickness and the aforementioned resonance frequencies frame coupling zones of at least two successive vibratory modes of the material in the bidimensional diagram of the curves F·T=f(W/T) of spread of the resonance frequencies relating to the piezoelectric material.

In the invention, the originality resides in the manner of utilizing vibratory modes that coexist in the so-called coupling zones of the diagram of spread of the resonance frequencies of the piezoelectric material used. This utilization is effected by a suitable choice of the geometric characteristics of the piezoelectric elements and especially of their thickness and in voluntarily choosing operating zones of the transducer arrangement in which the operation of the transducers is not a single mode operation. Thus, the sensitivity of transducing is increased both because of the utilization of several resonance modes having high electromechanical couplings and through satisfactory damping of residual and harmonic modes.

In order that the invention may be readily carried out, it will now be described more fully, by way of example, with reference to the accompanying drawings, in which.

Figure 1:
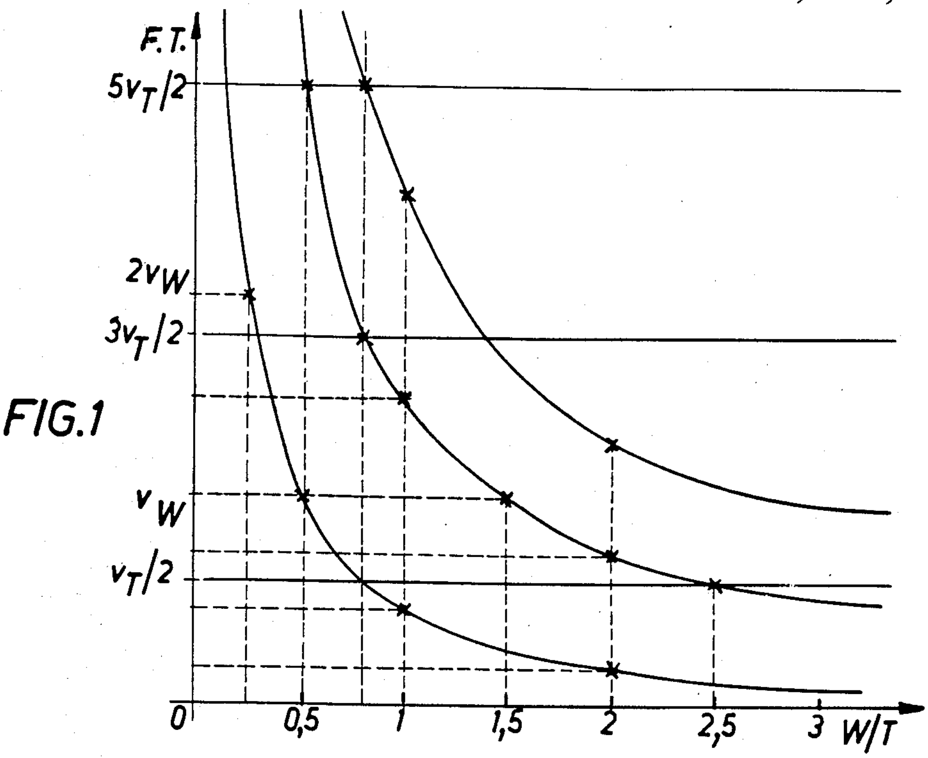
FIGS. 1 and 2 show examples of Fabian-Sato diagrams illustrating the curves of spread of the piezoelectric resonance frequencies and strengthened elastic resonance or antiresonance frequencies of a transducer, respectively, according to its thickness and according to its width.

If a simple rod in the form of an elastic parallelepipedon (see FIG. 11) is considered, the vibratory state of the resonant cavity constituted thereby is decoupled when the elastic vibrations in the thickness T are independent of those in the width W (and conversely). The resonance frequencies in the thickness T of the cavity are then given by the expression:

$$F^{(T)}_{(2n+1)} = \frac{1}{2}(2n+1)\frac{v_T}{T}, \quad (1)$$

where n is a positive integer or zero and $v_T$ is the speed of propagation of the ultrasonic waves in T (assumed to be independent of the ratio W/T). Consequently, the product F·T (which is the quantity represented on the ordinate in the diagrams of Fabian-Sato) is given by the expression:

$$F^{(T)}_{(2n+1)} \cdot T = \frac{1}{2} \cdot (2n+1)v_T, \quad (2)$$

to which corresponds a network of straight lines parallel to the axis of the abscissae (FIG. 1).

Likewise, the resonance frequencies of the cavity in the width W are given by the expression:

$$F^{(W)}_{(2n+1)} = \frac{1}{2}(2n+1)\frac{v_W}{W}, \quad (3)$$

where $v_W$ is the speed of propagation in W (also assumed to be independent of the ratio W/T), and the product F·T by the expression:

$$F^{(W)}_{(2n+1)} \cdot T = \frac{1}{2}(2n+1)\frac{v_W}{(W/T)}, \quad (4)$$

to which corresponds a network of hyperbolae also represented in FIG. 1.

Figure 2:
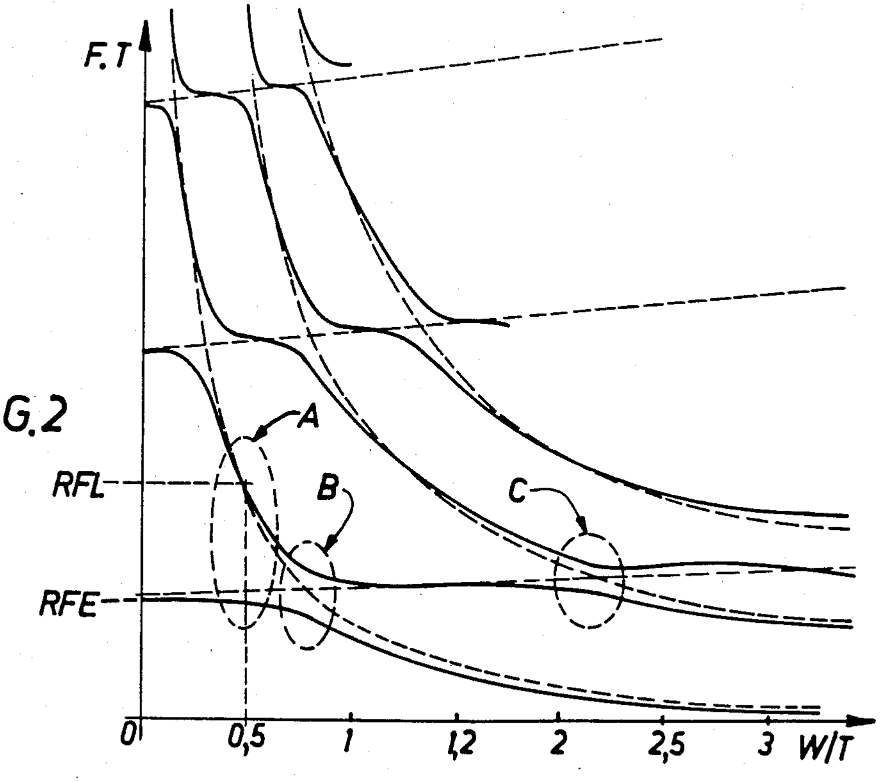

These network of straight lines and hyperbolae are ideal networks of asymptotes which are the limits, obtained in the case of a decoupled rod, of the asymptotes of the curves of spread observed in the case of a piezoelectric rod whose vibratory states according to the thickness and the width are coupled. In the latter case, the diagram of spread of the frequencies has a shape such as represented in FIG. 2. The observation of the curves of this diagram shows, for example, that near W/T=0.5 (cf. the block A of this FIG. 2) the fundamental thickness resonance RFE (first "horizontal" asymptote) corresponds approximately to half the fundamental width resonance RFL (first hyperbolic asymptote) that is, that the fundamental width resonance RFL corresponds approximately to the second harmonic of the fundamental thickness resonance RFE. From the piezoelectric point of view, the excitation of the thickness resonance consequently implies only a weak excitation of the width resonance, which becomes manifest in an increase near of the effective electromechanical coupling coefficient associated with the thickness resonance W/T=0.5. The fact that this single-mode resonance is obtained is utilized in the aforementioned patent, in which perturbing vibratory modes are suppressed for the benefit of a single vibratory mode.

Paradoxically according to the invention the inverse procedure is effected, that is to say that coupling zones of the resonances are chosen in the Fabian-Sato diagram corresponding to a given piezoelectric material. This choice is effected by choosing values of the ratio W/T corresponding to the points of intersection of the asymptotes of the lateral and thickness resonance characteristics (examples of such points of intersection are indicated in the blocks B and C of FIG. 2). In fact, in the zones enclosing these points of intersection, the simultaneous presence of two resonance modes whose frequencies and electromechanical coupling efficiencies are close to each other is observed. With respect to these so-called twin modes, the other modes, as shown in FIG. 2, are distinctly more remote in frequency from each other (or have electromechanical coupling efficiencies which are much lower).

Figure 3:
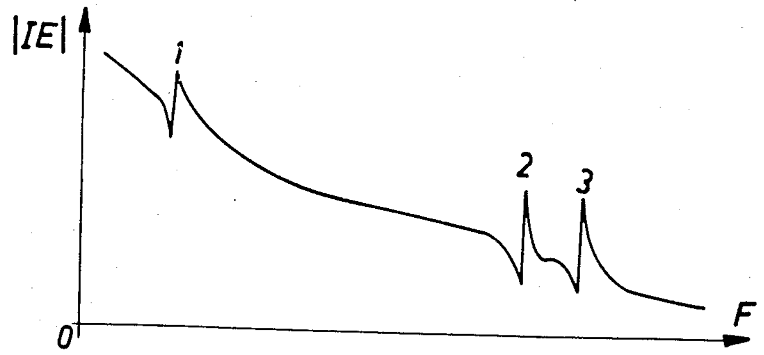
FIG. 3 shows the curve of variation of the module |IE| of the electrical impedance as a function of the frequency in the case of the coupling zone corresponding to the block C of FIG. 2.

During the characterization of a piezoelectric material, it is interesting to define another type of relation than the diagram already mentioned, i.e. that which connects the module of the electrical impedance IE of the material with the working frequency of the ultrasonic transducer arrangement obtained with this material. A curve representing this relation is shown in FIG. 3. When reading this curve, the values of the piezoelectric resonance frequencies of the material (i.e. the frequency values for which the impedance has a relative minimum and, the conversion of energy consumed by the transducer arrangement is a maximum) and the values of its antiresonance frequencies, which are designated as strengthened elastic frequencies and which correspond to relative maxima of the value of the electrical impedance can be determined.

The ultrasonic transducer arrangement described here preferably has the following structure: a network of piezoelectric transducer elements having the form of rectangular plates of piezoelectric material (realized in general from a single plate which has been cut), these plates of a length H, of a width W and of a thickness T having their front and back surfaces provided with electrodes and being arranged parallel to each other and at regular distances, with their surfaces having the dimensions H and T facing each other. The structure according to the invention is then characterized in that the thickness of the piezoelectric elements is chosen equal to half the wavelength corresponding to a frequency substantially equal to the average value of two successive resonance frequencies of the piezoelectric material concerned.

Figure 4:
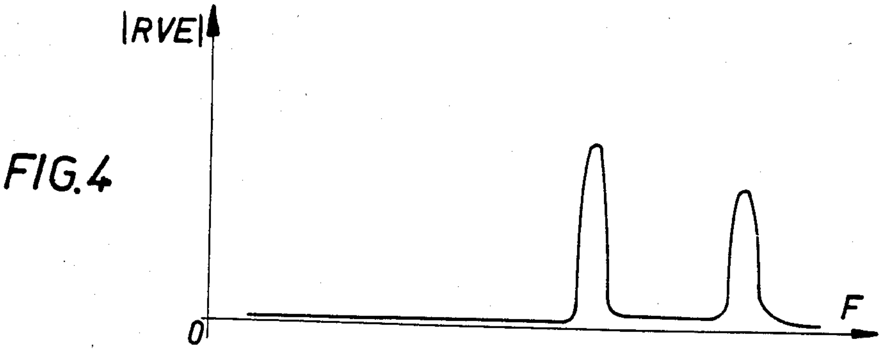
FIGS. 4 and 5 show the curves of variation of the unidimensional transfer function RVE (ratio vibratory speed/electrical excitation) associated with FIG. 3 in the case of the coupling zones corresponding to the blocks B and C, respectively, of FIG. 2.
Figure 5:
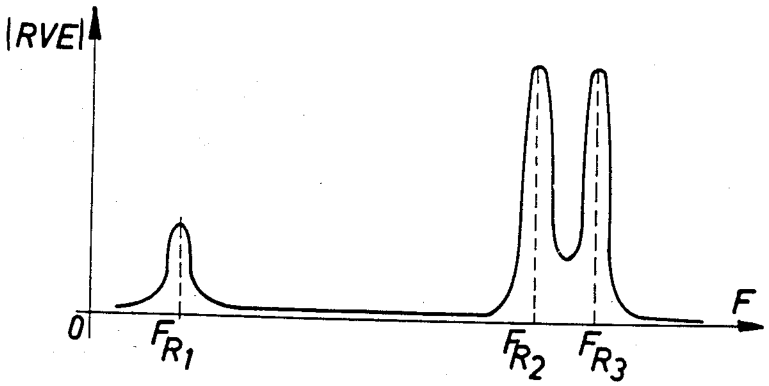
Figure 6:
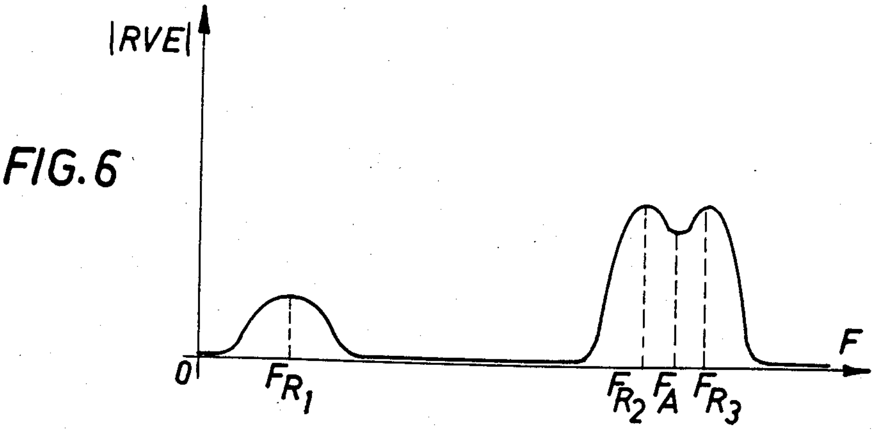
FIGS. 6 through 8 show the evolution of the curve of FIG. 5 on the one hand when only the internal losses of the material are taken into account with respect to FIG. 5 and on the other hand when the transducer arrangement has been matched by means of an interferential transfer function structure TFA given in FIG. 7.

An associated curve of the unidimensional transfer function (examples corresponding to the twin modes of the zones corresponding to the blocks B and C of FIG. 2 are given in FIGS. 4 and 5, respectively), which represents the variation of the module |RVE| of the ratio vibratory speed/electrical excitation at the terminals as a function of the frequency corresponds to the impedance curve of FIG. 3. If such a transfer function takes into account the internal losses of the piezoelectric material, the resonances presented by this transfer function are damped (cf. FIG. 6 corresponding to the zone C of FIG. 2).

Figure 7:
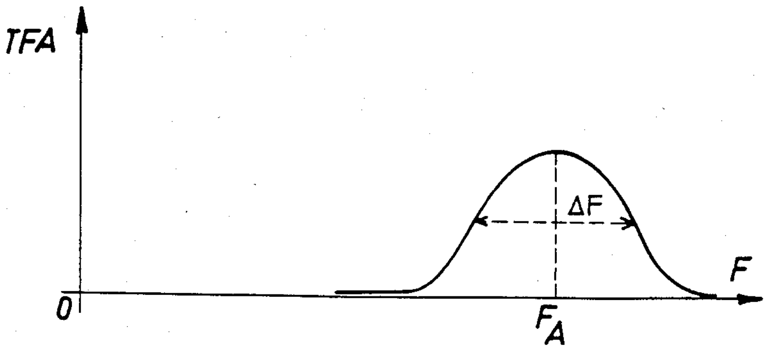
Figure 8:
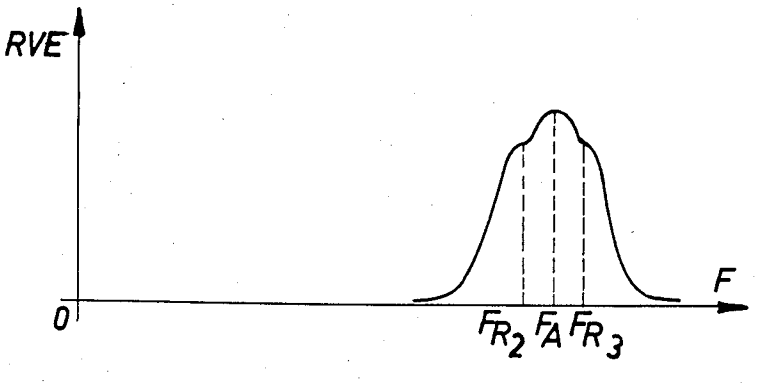

Hitherto, the case was considered of an ultrasonic transducer arrangement without matching layers having simply two media of propagation of the semi-infinite type on the front and back surfaces provided with electrodes. The arrangement can be provided with an interferential transmittance structure resonating at the frequency $F_A$, this structure comprising one or several matching layers on the front or on the back or on the front and on the back of the piezoelectric material. $F_A$ is the average frequency in the example of FIG. 6 of the frequencies $F_{R2}$ AND $F_{R3}$ corresponding to the maxima of the transfer function, these maxima themselves, corresponding as observed, to the minima of the associated electrical impedance curve. The matching is obtained, for example, by means of a single interferential quarter wavelength layer tuned to the frequency $F_A$. The distance ΔF shown in FIG. 7 shows the transfer function corresponding to this matching structure and is more precisely the width at half the height of the transmittance of the quarter wavelength layer tuned to $F_A$ whilst taking into account the acoustic impedances of the adjacent media. If the matching thus obtained is such that the extent $\Delta F/F_A$ is larger than the relative distance between the relevant twin modes, (i.e. $(F_{R3}-F_{R2})/F_A$ in the case of the modes 2 and 3 indicated by the zone C of FIG. 2) the transfer function (in which in FIG. 6, in spite of the damping due to the losses, the maxima due to the coexistence of two modes still appeared) now has the form shown in FIG. 8. More precisely, the quasi Gaussean single mode situation is now obtained, of which the advantages are known and which permits of obtaining a quasi Gaussean envelope pulse response, while the absence or the presence of higher harmonics can be controlled by biasing the electrical charge conditions of the transducer upon transmission and upon reception.

These charge conditions can also be used to improve by electrical matching the Gaussean aspect of the modulus of the spectrum of the pulse response. For example, in the case of the twin modes, corresponding to the zone indicated by the block B of FIG. 2, the relative distance of the coupled modes 1 and 2 is such that it is then necessary to impart to the transducer arrangement not only a wide band matching structure—several quarter wavelength layers, that may be tuned relatively offset—, but also an electrical matching network constituted, for example, simply by a series resistor and a parallel inductor.

Of course, the invention is not limited to embodiments described, of which variations may be proposed without departing from the scope of the invention.

More particularly, the invention has been described for a coupling zone, in which two vibratory modes coexist, but if there exist on the diagram of spreading coupling zones having a larger number of modes, for example three, the thickness of the piezoelectric transducer elements will be in this case half the wavelength associated with a frequency equal to the average value of the three corresponding resonance frequencies.

Moreover, throughout the description, the term "average value" is to be understood to mean any simple arithmetic or geometric average value or an average value of complex nature, such as a quadratic average value or a weighted average value, in which event the weighting of each frequency can be effected, for example, by the electromechanical coupling coefficient associated with each of them in the vibratory mode concerned.

Figure 9:
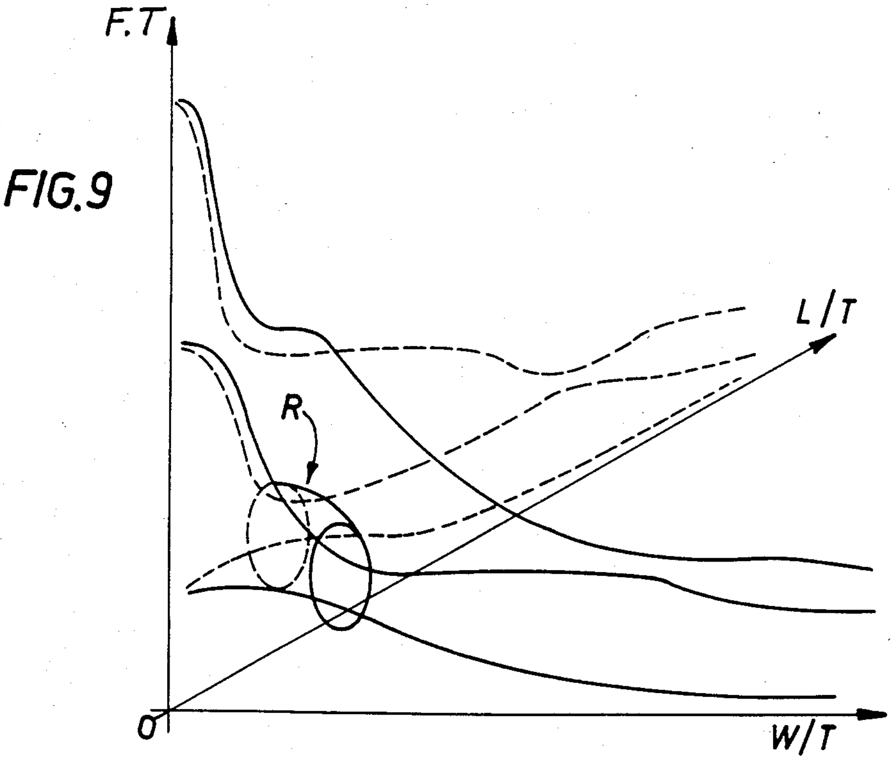
FIG. 9 shows an example of a tridimensional Fabian-Sato diagram.

Finally, the invention can be applied in a quite similar manner in the case of vibratory tridimensional states when the ultrasonic transducer arrangement is a bidimensional slotted assembly of a network of piezoelectric transducer elements in the form of a parallelepipedon. It is then sufficient to consider a tridimensional generalization of the Fabian-Sato diagrams, the product F·T being in this case a function no longer of the single ratio W/T, but of the two ratios of geometric configuration W/T and H/T (a bidimensional Fabian-Sato diagram, such as shown in FIG. 2, is the limit—when H and hence H/T become large—of a tridimensional Fabian-Sato diagram). The planar coupling zones observed in the bidimensional diagrams in this case become coupling zones having three dimensions, tubular regions, such as the region R indicated by an arrow in FIG. 9, showing the shape of a tridimensional Fabian-Sato diagram because of the reversibility between the dimensions H and W, according as one or the other is larger, this tridimensional diagram and the particular coupling zones observed therein have a symmetry with respect to the bisectrix plane of the axes (0, H/T) (0, W/T).

Figure 10:
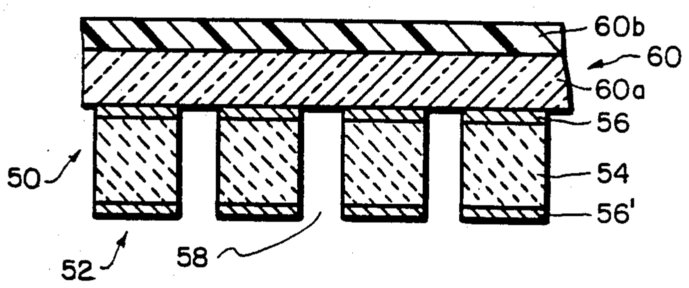
FIGS. 10 and 11 illustrate an array of transducer elements in accordance with the invention.
Figure 11:
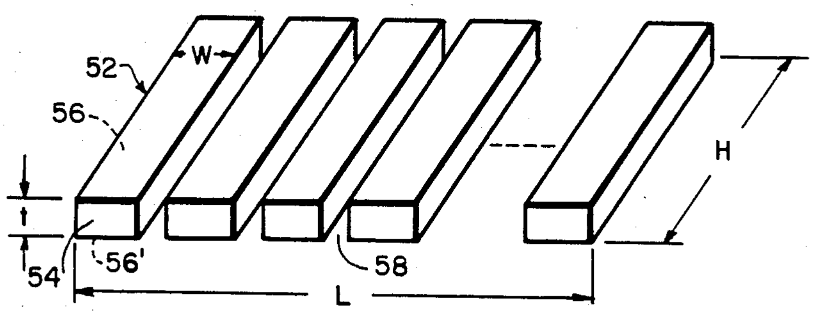

FIGS. 10 and 11 show an ultrasound transducer 50 in accordance with the invention. The transducer 50 has a multiplicity of transducer elements 52 which are arranged in a row at small intervals. Each element 52 has a length H a thickness t and a width W. Each element 52 is an elongate rectangular plate 54 of a piezoelectric material with two electrode films 56 and 56′ respectively coated on its front and back surfaces. Piezoelectric ceramics including lead-titanate (PC-1), two component systems such as lead-titanate-zirconate (PC-2) and three component systems typified by a system composed of a lead-titanate, lead-zirconate, and lead-magnesium-niobate (PC-3) are useful as the material of the plate 54. The electrode films 56 and 56′ utilize a commonly employed metal such as gold, silver, aluminum, copper, or indium and are formed by vacuum evaporation, soldering, plating, flame spraying or application of a paint followed by baking.

The rectangular elements 52 are arranged in a row, for example in a straight linear row, with their longer sides (normal to the surfaces coated with the electrode films 56 and 56′ ) opposite to each other as shown in FIG. 11.

The transducer 50 has an acoustic impedance matching layer 60 which is placed on the row of transducer elements 52 so as to be in intimate contact and entirely cover the front electrode films of all elements. In accordance with the invention the impedance matching layer may comprise an inner layer 60*a* and an outer layer 60*b* in accordance with the teachings of the referenced U.S. Pat. No. 4,101,795.

What is claimed is:

1. In an ultrasonic transducer which comprises a linear assembly of parallel transducer elements of piezoelectric material, each element having a width W:

the improvement wherein the thickness T of each of the transducer elements is equal to one-half of the wavelength corresponding to a frequency F which is equal to the average of at least two successive piezoelectric resonance frequencies of the piezoelectric material and wherein the products of the thickness T and the two resonance frequencies frame coupling zones of at least two successive vibratory modes of the material in the bidimensional diagram of the curves $F \cdot T = f(W/T)$ of the spread of the resonance frequencies of the piezoelectric material.

2. An ultrasonic transducer as claimed in claim 1 comprising several linear parallel assemblies of piezoelectric transducer elements, each element being in the form of a parallelepipedon having a length H and a width W wherein the products of the thickness and the resonance frequencies frame coupling zones of at least two successive vibratory modes of the material in the tridimensional diagram of the curves $F \cdot T = f(W/T, H/T)$ of the spread of resonance frequencies of the piezoelectric material.

* * * * *